US012763761B2

(12) United States Patent
Butenhoff et al.

(10) Patent No.: US 12,763,761 B2

(45) Date of Patent: Oct. 13, 2026

(54) APPARATUS TO MANAGE SLEW CONDITIONS

(71) Applicant: Texas Instruments Incorporated, Dallas, TX (US)

(72) Inventors: Michael Edwin Butenhoff, Minnesota City, MN (US); Shyamsunder Balasubramanian, Plano, TX (US); Toshio Yamanaka, Plano, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 18/962,430

(22) Filed: Nov. 27, 2024

(65) Prior Publication Data

US 2026/0149439 A1 May 28, 2026

(51) Int. Cl.

| | |
|---|---|
| ***H03K 19/00*** | (2006.01) |
| ***H02M 1/00*** | (2006.01) |
| ***H02M 3/158*** | (2006.01) |
| ***H03K 3/356*** | (2006.01) |
| ***H03K 5/1534*** | (2006.01) |
| ***H03K 19/0185*** | (2006.01) |

(52) U.S. Cl.

CPC ........ *H03K 5/1534* (2013.01); *H02M 1/0029* (2021.05); *H02M 3/158* (2013.01); *H03K 3/356113* (2013.01); *H03K 19/018528* (2013.01)

(58) Field of Classification Search

CPC ........... H03K 5/1534; H03K 3/356113; H02M 1/0029; H02M 3/158; H02K 19/018528

See application file for complete search history.

(56) References Cited

U.S. PATENT DOCUMENTS 11,671,080 B1 * 6/2023 Ross .............. H03K 19/018507 327/333

2004/0217794 A1 * 11/2004 Strysko ................ H03H 11/265 327/263

2005/0243580 A1 * 11/2005 Lyle, Jr. ............. H05B 41/3927 363/16

(Continued)

OTHER PUBLICATIONS

Texas Instruments Incorporated, "DRV3233-Q1 Automotive 24/12-V Battery 3-Phase Gate Driver Unit with accurate current sensing and enhanced diagnostics," Data Sheet, Sep. 2023, 12 pages.

(Continued)

*Primary Examiner* — Tuan T Lam

(74) *Attorney, Agent, or Firm* — Xianghui Huang; Frank D. Cimino

(57) ABSTRACT

An example circuit includes a rising edge detection circuit including an input and an output. The circuit also includes a falling edge detection circuit including an input and an output. The circuit also includes a power supply compensation circuit including a first input coupled to the output of the rising edge detection circuit and a second input coupled to the output of the falling edge detection circuit, a first output, and a second output. The circuit also includes a first power supply having a first terminal and a second terminal, the first terminal coupled to the first output of the power supply compensation circuit, and a second power supply having a first terminal and a second terminal, the first terminal coupled to the second output of the power supply compensation circuit.

20 Claims, 10 Drawing Sheets

(56) References Cited

U.S. PATENT DOCUMENTS

| | | | | |
|---|---|---|---|---|
| 2017/0169787 | A1 * | 6/2017 | Zhang | G09G 3/3677 |
| 2017/0288655 | A1 * | 10/2017 | He | H03K 21/02 |
| 2019/0280473 | A1 * | 9/2019 | Akahane | H02M 7/48 |
| 2022/0206084 | A1 * | 6/2022 | Tan | H03K 19/20 |

OTHER PUBLICATIONS

Rajaram, "Understanding Functional Safety FIT Base Failure Rate Estimates per IEC 62380 and SN 29500," Texas Instruments Incorporated, Apr. 30, 2024, 9 pages.

Texas Instruments Incorporated, "DRV816x 100V Half-Bridge Smart Gate Driver with Integrated Protection and Current Sense Amplifier," Data Sheet, May 2024, 43 pages.

* cited by examiner

600

APPARATUS TO MANAGE SLEW CONDITIONS

TECHNICAL FIELD

This description relates generally to driver circuits and, more particularly, to apparatus to manage slew conditions.

BACKGROUND

Inductive load driver circuits, such as driver circuits for electric motors, experience slew conditions in which a particular voltage value changes in a relatively short period of time. In some cases, a bootstrap capacitor is used at an interface between the load driver circuit and one or more load switches to maintain voltage values of a switch node. In some cases, the slew conditions are a function of motor winding switching rates.

SUMMARY

An example circuit includes a rising edge detection circuit including an input and an output. The circuit also includes a falling edge detection circuit including an input and an output. The circuit also includes a power supply compensation circuit including a first input coupled to the output of the rising edge detection circuit and a second input coupled to the output of the falling edge detection circuit, a first output, and a second output. The circuit also includes a first power supply having a first terminal and a second terminal, the first terminal coupled to the first output of the power supply compensation circuit, and a second power supply having a first terminal and a second terminal, the first terminal coupled to the second output of the power supply compensation circuit.

An example circuit includes a rising edge detection circuit including an input and an output, a falling edge detection circuit including an input and an output, and a state hold circuit including a first transistor having a first control terminal, a first terminal, and a second terminal. The state hold circuit also includes a second transistor having a second control terminal, a first terminal, and a second terminal, and a third transistor having a third control terminal, a first terminal, and a second terminal, the first control terminal and the second control terminal coupled to (a) the output of the rising edge detection circuit and (b) the first terminal of the third transistor. The circuit also includes a first resistor having a first terminal and a second terminal, a second resistor having a first terminal and a second terminal, and a latch circuit including a first control input and a second control input, the first terminal of the first transistor coupled to the second control input, and the first terminal of the second transistor coupled to the first control input.

An example apparatus includes a detection circuit to detect a slew condition, the slew condition including a first voltage input, and a power supply compensation circuit to divert the first voltage to a first power supply during the slew condition, the detection circuit to deactivate the power supply compensation circuit based on a second voltage input.

Figure 1:
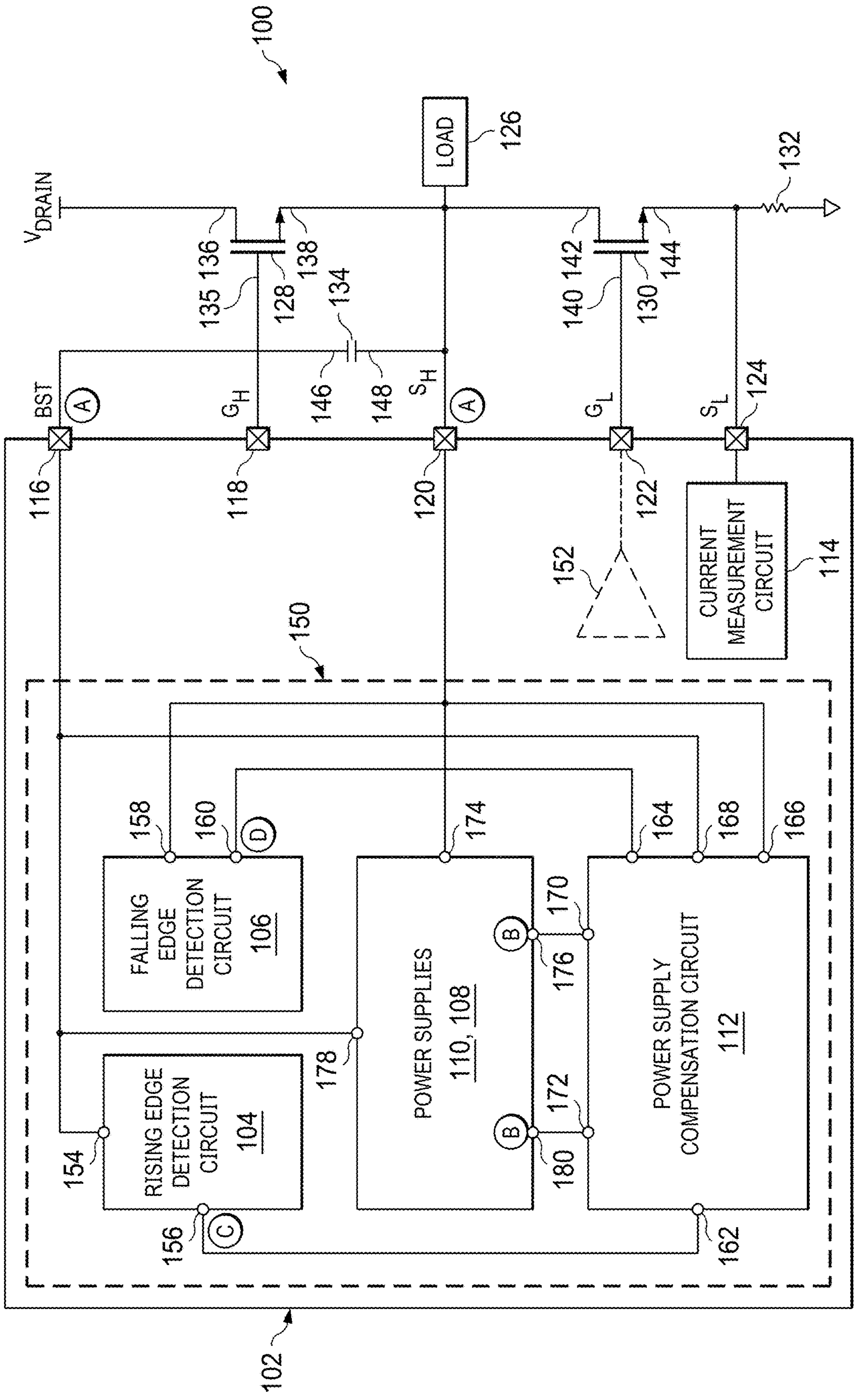
FIG. 1 is a block diagram of an example motor driver circuit in which an example collapse prevention circuit operates to prevent power supply collapse during a slew condition.

The drawings are not necessarily to scale. Generally, the same reference numbers in the drawing(s) and this description refer to the same or similar (functionally and/or structurally) features and/or parts. Although the drawings show regions with clean lines and boundaries, some or all of these lines and boundaries may be idealized. In reality, the boundaries or lines may be unobservable, blended or irregular.

DETAILED DESCRIPTION

Connections between driver integrated circuits (ICs) and loads can experience fast slew rates exceeding 50 volts/nanosecond. In motor driver applications, the motor driver ICs may use power supplies (e.g., floating power supplies) in view of gate-to-source limitations, such as a 5-volt limit. However, in the event of a slew condition the power supply may not be able to maintain this threshold voltage, in which case the power supply fails to supply a current at an expected voltage (e.g., collapses). Also, absent the power supply capability to maintain a proper (threshold) voltage, load control signals (e.g., low-voltage motor phase control signals from one or more level shifters) cannot be provided to load switches and such load control signals become compromised with erroneous or otherwise unstable values. Such instability results in a loss of control of the load, such as an electric motor, being driven by the driver IC, which can result in dangerous “shoot-through” effects.

FIG. 1 is a block diagram of an example motor driver circuit 100 that includes an example collapse prevention circuit 102. The collapse prevention circuit 102 includes a rising edge detection circuit 104, a falling edge detection circuit 106, a first power supply 108, a second power supply 110, a power supply compensation circuit 112, and a current measurement circuit 114. The collapse prevention circuit 102 includes a boot strap (BST) node 116, a gate-high (GH) output 118, a source-high (SH) node 120, a gate-low (GL) output 122, and a source-low (SL) input 124. The motor driver circuit 100 of FIG. 1 also includes a load 126, such as an inductive load (e.g., an electric motor, a buck converter, etc.), a first drive switch 128 (e.g., a high-side power transistor), a second drive switch 130 (e.g., a low-side power transistor), a current sense resistor 132, and a bootstrap capacitor 134 to maintain a voltage between the BST node 116 and the SH node 120. In some examples, the collapse prevention circuit 102 is part of a driver circuit to drive the load 126 by activating the first drive switch 128 and the second drive switch 130 at a particular frequency. The first drive switch 128 includes a control terminal 135, a drain terminal 136, and a source terminal 138. The second drive switch 130 includes a control terminal 140, a drain terminal 142, and a source terminal 144. The bootstrap capacitor 134 includes a first terminal 146 and a second terminal 148.

The illustrated example of FIG. 1 includes a source-high (SH) collapse prevention circuit 150 having circuitry to control and monitor slew conditions associated with the source-high (SH) node 120 and the BST node 116. In particular, the SH collapse prevention circuit 150 includes the rising edge detection circuit 104, the falling edge detection circuit 106, the first power supply 108, the second power supply 110, and the power supply compensation circuit 112. In some examples, the SH collapse prevention circuit 150 is referred to as a half-bridge circuit having a high-side FET 128 (e.g., the first drive switch 128) and a low-side FET 130 (e.g., the second drive switch 130). On the other hand, control and monitoring of slew conditions associated with the GL output 122 are performed by a source-low (SL) collapse prevention circuit 152 having circuitry therein substantially similar to the SH collapse prevention circuit 150. In some examples, the SL input 124 will include a positive supply referred to herein as GVDD. While the illustrated example of FIG. 1 includes two separate example collapse prevention circuits 150, 152, examples disclosed herein are not limited thereto. In some examples the collapse prevention circuit 102 includes any number of collapse prevention circuits that correspond to any number of phases associated with an end-use application (e.g., a three-phase motor).

In the illustrated example of FIG. 1, the rising edge detection circuit 104 includes an input 154 and an output 156. The falling edge detection circuit 106 includes an input 158 and an output 160. The power supply compensation circuit 112 includes a first input 162, a second input 164, a third input 166, a fourth input 168, a first output 170, and a second output 172, as described in further detail below.

In operation, the example first power supply 108 and second power supply 110 are low voltage devices relative to the load 126, the first switch 128 and the second switch 130. In some examples, the first power supply 108 and the second power supply 110 are floating power supplies. The first power supply 108 includes a second terminal 174 coupled to the SH node 120, and a first terminal 176 coupled to the first output 170 of the power supply compensation circuit 112. The second power supply 110 includes a second terminal 178 coupled to the BST node 116, and a first terminal 180 coupled to the second output 172 of the power supply compensation circuit 112. The power supplies 108, 110 and motor driver circuitry associated therewith represent a low voltage domain. The rising edge detection circuit 104, the falling edge detection circuit 106, the power supply compensation circuit 112, the load 126, the first switch 128 and the second switch 130 represent or otherwise operate in a high voltage domain. In some examples, the low voltage domain operates at 5-volts in view of gate-source limitations of transistors therein, and the high voltage domain operates at or above 110-volts. In response to slew rates at the load 126 exceeding particular threshold levels, the first power supply 108 and the second power supply 110 of the low voltage domain collapse. As used herein, a slew rate represents a voltage change per unit of time and slew rates of approximately 50 volts/nanosecond result in one or more negative effects on the motor driver circuit 100.

For example, excessive slew rates (e.g., slew rates having a threshold voltage magnitude, slew rates having a threshold time duration), referred to herein as a slew condition, result in negative or otherwise undesirable circuit operating conditions (e.g., power supply collapse, driver signal instability, etc.). For instance, in response to a power supply collapse caused by a slew condition, control signals from drive circuitry to the first switch 128 or the second switch 130 may become indeterminate and result in unpredictable activation when the slew condition occurs and/or ends (e.g., the slew activity reverts to normal or otherwise non-transient values having a relatively lower voltage magnitude or a relatively slower voltage change per unit of time, a non-slew condition). In response to the slew condition ending, a phenomenon referred to as "shoot through" may occur when one or more of the first switch 128 and the second switch 130 become energized at the same time, or at a time that is out of phase with the load 126. In some examples, and as described in further detail below, control logic (e.g., level shifters) deviates from expected behaviors when their corresponding power supply fails to maintain (e.g., collapse) an adequate voltage (e.g., greater than 2-volts in some examples, but examples disclosed herein are not limited thereto and may have alternate values in view of different processes).

Previous solutions to mitigate the negative effects of a slew condition included detecting a threshold slew rate in the low voltage domain and activating one-shot current supplies to maintain voltage/current power supply values capable of keeping control logic behaviors predictable. While low voltage domain monitoring facilitates a manner of slew condition detection, a corresponding finite latency is associated with instantiating one-shot current techniques, which still results in a power supply collapse. However, examples described herein detect the slew condition on connections to the load on the high voltage domain to direct, route or otherwise divert slew currents to the power supplies in a manner that overcomes latency limitations of low voltage domain monitoring techniques. In particular, examples described herein direct slew condition energy (currents, voltages) in particular directions to the power supplies to prevent collapse, and disable inputs to level shifters (hold mode) throughout the duration of the slew condition, thereby avoiding unpredictable state changes to the first switch 128 and the second switch 130.

As described in further detail below, the rising edge detection circuit 104 employs capacitors to sense rising edges of the load 126 and the falling edge detection circuit 106 employs capacitors to sense falling edges of the load 126. In response to detecting a transition that satisfies a threshold (e.g., a threshold slew condition having and exceeding a threshold voltage or a threshold duration), the power supply compensation circuit 112 routes slew currents to respective ones of the first power supply 108 or the second power supply 110 to prevent a collapse condition from occurring.

In the example of FIG. 1, the transistors 128 and 130 may be n-channel metal-oxide semiconductor field-effect transistors (MOSFETs). Alternatively, the transistors 128, 130 may be n-channel field-effect transistors (FETs) (n-channel FETs or NFET), n-channel insulated-gate bipolar transistors (IGBTs), n-channel junction field effect transistors (JFETs), NPN bipolar junction transistors (BJTs) or, with slight modifications, p-type equivalent devices. In some examples, the transistor 128 is a p-channel MOSFETs. Alternatively, the transistor 128 may be a p-channel FET (p-channel FET or PFET), p-channel IGBT, p-channel JFET, PNP BJT, or, with slight modifications, N-type equivalent devices. The transistors 128, 130 may be depletion mode devices, drain-extended devices, enhancement mode devices, natural transistors or other type of device structure transistors. Furthermore, the transistors 128, 130 may be implemented in/over a silicon substrate (Si), a silicon carbide substrate (SiC), a gallium nitride substrate (GaN) or a gallium arsenide substrate (GaAs).

In operation, a detection circuit, such as one of the rising edge detection circuit 104 or the falling edge detection circuit 106, detects a slew condition. In some examples, the slew condition includes a first voltage input value, such as a threshold voltage. In response to detection of the first voltage input value associated with the slew condition, the detection circuit (e.g., the rising edge detection circuit 104 or the falling edge detection circuit 106) causes the power supply compensation circuit 112 to divert energy from a source of the slew condition to one or more of the first power supply 108 or the second power supply 110 to prevent a collapse condition. As described in further detail below, the power supply compensation circuit 112 energizes one or more switches (e.g., transistors) to create a path for the slew energy to reach one or more affected power supplies. In response to the detection circuit determining or otherwise detecting that the slew condition has ended, such as in response to detecting a second/subsequent voltage value, at least one of the rising edge detection circuit 104 or the falling edge detection circuit 106 causes the power supply compensation circuit 112 to discontinue or otherwise deactivate the power supply compensation circuit 112 during normal operating conditions (e.g., during conditions where a slew condition is not occurring). As a result, system efficiency is improved by, in part, reducing the raised bias currents that are only required during the slew event and shortly thereafter back to low level steady state values.

Figure 2:
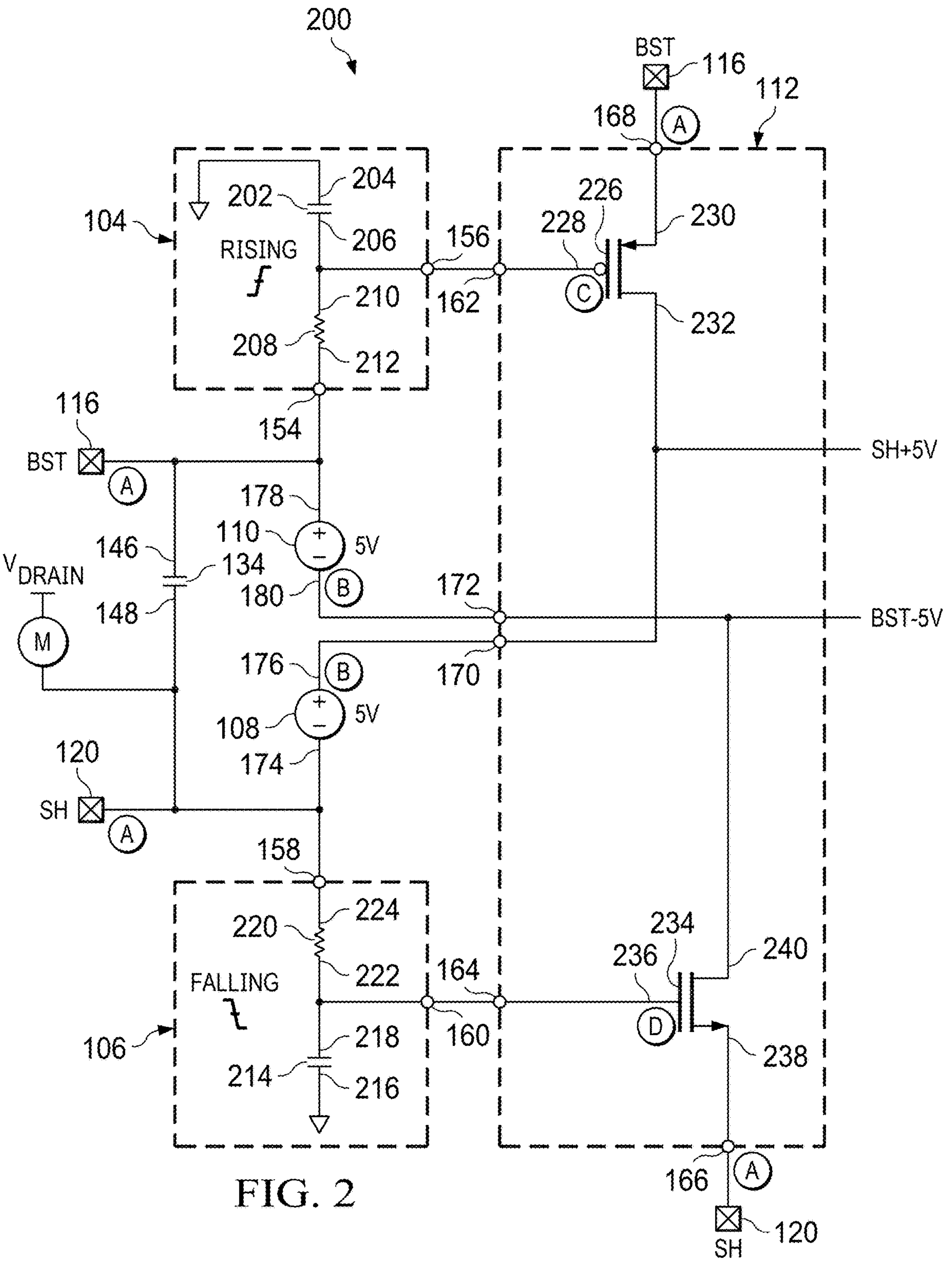
FIG. 2 is a block diagram of a portion of the motor driver circuit of FIG. 1 to prevent power supply collapse during a slew condition.

FIG. 2 is a block diagram of a portion 200 of the motor driver circuit 100 of FIG. 1. In particular, the illustrated example of FIG. 2 includes a circuit schematic representation of the rising edge detection circuit 104, the falling edge detection circuit 106, the power supply compensation circuit 112, the first power supply 108, the second power supply 110, and the bootstrap capacitor 134. In the illustrated example of FIG. 2, the rising edge detection circuit 104 includes the input 154, the output 156, a capacitor 202 having a first terminal 204 and a second terminal 206, and a resistor 208 having a first terminal 210 and a second terminal 212. In some examples, the capacitor 202 is referred to as a slew detection capacitor 202. The falling edge detection circuit 106 includes the input 158, the output 160, a capacitor 214 having a first terminal 216 and a second terminal 218, and a resistor 220 having a first terminal 222 and a second terminal 224. In some examples, the capacitor 214 is referred to as a slew detection capacitor 214. In some examples, the capacitor 202 or the capacitor 214 includes a capacitance value between approximately 20 femto-farads (fF) and 50 fF sized to detect slew rates of approximately 0.5 volts/nSec or greater. However, examples described herein are not limited thereto and may by sized with alternate values without limitation. The power supply compensation circuit 112 includes a first transistor 226 having a control terminal 228, a source terminal 230 and a drain terminal 232, and a second transistor 234 having a control terminal 236, a source terminal 238 and a drain terminal 240. The power supply compensation circuit 112 also includes the first input 162, the second input 164, the third input 166, the fourth input 168, the first output 170, and the second output 172.

In the illustrated example of FIG. 2, the first power supply 108 has the first terminal 176 and the second terminal 174, and the second power supply 110 has the first terminal 180 and the second terminal 178. The bootstrap capacitor 134 has the first terminal 146 and the second terminal 148.

In the illustrated example of FIG. 2, the input 154 of the rising edge detection circuit 104 is coupled to the second terminal 178 of the second power supply 110, and the output 156 of the rising edge detection circuit 104 is coupled to the control terminal 228 of the first transistor 226 of the power supply compensation circuit 112. The input 158 of the falling edge detection circuit 106 is coupled to the second terminal 174 of the first power supply 108, and the output 160 of the falling edge detection circuit 106 is coupled to the control terminal 236 of the second transistor 234 of the power supply compensation circuit 112.

In operation, during circumstances in which a slew condition is not occurring at the BST node 116 (detected by the input 154 of the rising edge detection circuit 104), the resistor 208 and the capacitor 202 of the rising edge detection circuit 104 remain inactive. As such, the output 156 of the rising edge detection circuit 104 is not active, thereby causing the first transistor 226 to remain inactive or otherwise not conduct. However, in response to a rising edge slew condition occurring at the BST node 116, the resistor 208 and the capacitor 202 create a time constant, during which time the output 156 of the rising edge detection circuit 104 is high. The high signal from the output 156 drives the control terminal 228 of the first transistor 226, thereby turning on the first transistor 226 to conduct and route the excess slew current from the BST node 116 to the first power supply 108, thereby preventing its collapse during the rising edge slew condition. Stated differently, the excess current (a rising edge slew condition in this example) is injected into the positive side of the first power supply 108 as an aid to prevent collapse thereof. Because this excess rising edge current is used or otherwise directly routed to the first power supply 108 that would otherwise be at risk of collapse, the latency associated with detecting the slew condition and instantiating a responsive current injection technique on a low voltage domain is avoided. During the time constant created by the resistor 208 and the capacitor 202, the resistor 208 eventually pulls or otherwise drains the control terminal 228 (e.g., a gate of a PFET) to the BST node 116, in which case the gate-to-source voltage of the first transistor 226 will pull down to zero and turn off conduction after the rising edge slew condition ends.

In operation, during circumstances in which a slew condition is not occurring at the SH node 120 (detected by the input 158 of the falling edge detection circuit 106), the resistor 220 and the capacitor 214 of the falling edge detection circuit 106 remain inactive. As such, the output 160 of the falling edge detection circuit 106 is not active, thereby causing the second transistor 234 to remain inactive or otherwise not conduct. However, in response to a falling edge slew condition occurring at the SH node 120, the resistor 220 and the capacitor 214 create a time constant during which time the output 160 of the falling edge detection circuit 106 is high. The high signal from the output 160 drives the control terminal 236 of the second transistor 234, thereby turning on the second transistor 234 to conduct and route the excess slew current from the SH node 120 to the second power supply 110, thereby preventing its collapse during the falling edge slew condition. Stated differently, the excess current (a falling edge slew condition in this example) is injected into a negative side (the first terminal 180) of the second power supply 110 as an aid to prevent collapse thereof. Because this excess falling edge current is used or otherwise directly routed to the second power supply 110 that would otherwise be at risk of collapse, the latency associated with detecting the slew condition and instantiating a responsive current injection technique on a low voltage domain is avoided. During the time constant created by the resistor 220 and the capacitor 214, the resistor 220 eventually pulls or otherwise drains the control terminal (236) to the SH node 120, in which case the gate-to-source voltage of the second transistor 234 will pull down to zero and turn off conduction after the falling edge slew condition ends.

Figure 3:
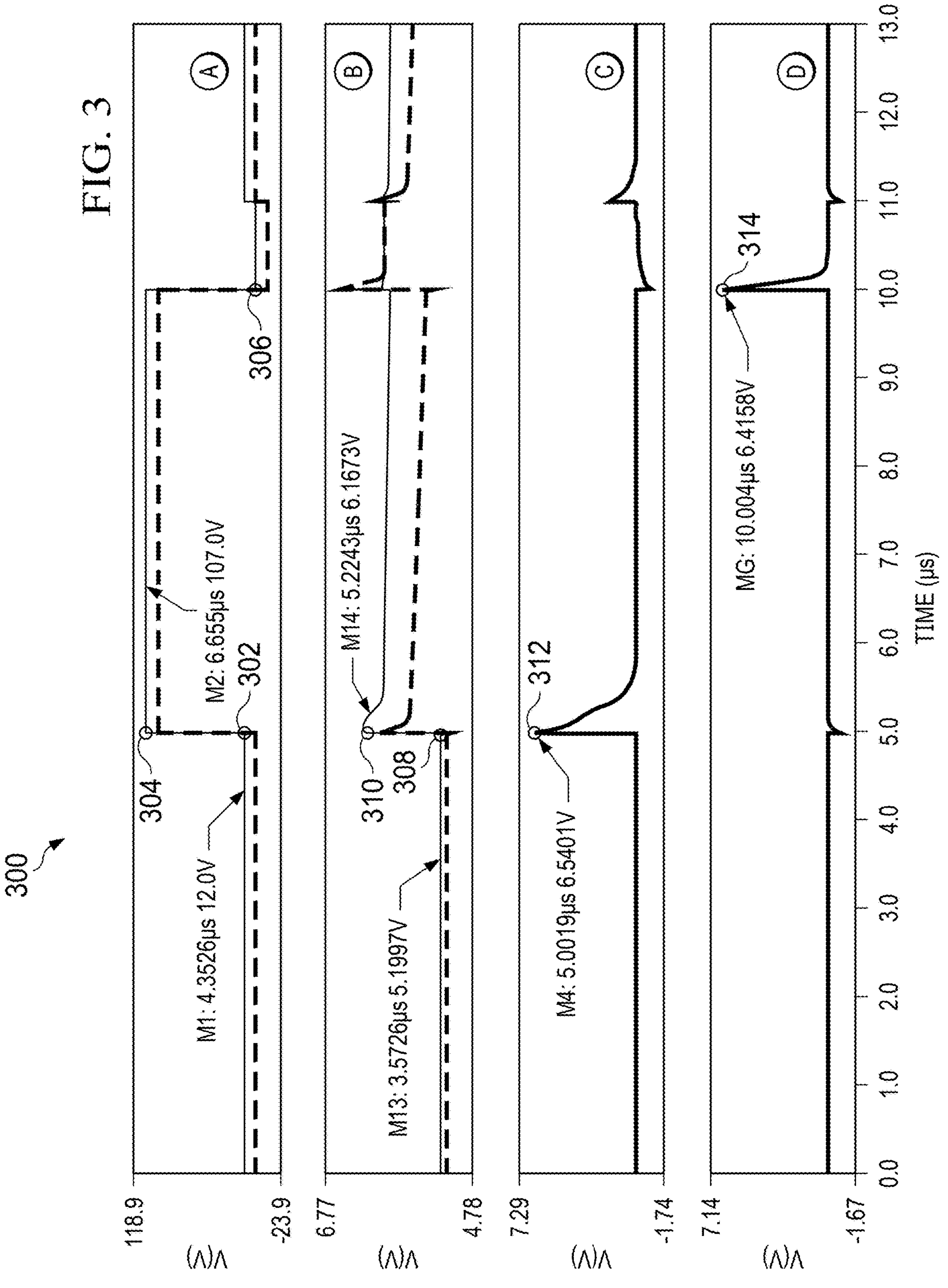
FIG. 3 is a signal diagram including four (4) signal traces corresponding to portions of the block diagram of FIGS. 1 and 2 during a slew condition.

FIG. 3 is a signal diagram 300 during a slew condition. In the illustrated example of FIG. 3, four (4) separate signal traces are shown with labels A, B, C and D. Signal trace A represents slew conditions at the BST node 116, in which the BST node 116 is at 12-volts at a first time (see label 302), 107-volts at a second time (see label 304), and zero volts at a third time (see label 306). During the transition between the first time 302 and the second time 304, the slew rate occurs at 50-volts/nSec (rising edge), which is a problematic slew rate in terms of both voltage magnitude and speed (rate of voltage change). The illustrated example of FIG. 3 shows a relatively steady state voltage at the BST node 116 and the SH node 120 between the second time 304 and the third time 306, and a second slew condition occurs (falling edge) at the third time 306. Absent corrective techniques, such slew rate occurrences are likely to result in power supply collapse events. Briefly turning to the illustrated example of FIG. 1, signal trace A is shown proximate to the BST node 116 and the SH node 120, which is where the slew condition occurs in some examples. Similarly, and briefly turning to the illustrated example of FIG. 2, signal trace A is shown proximate to the BST node 116 and the SH node 120 (the dashed trace).

Returning to the illustrated example of FIG. 3, the signal diagram 300 includes signal trace B to represent beneficial effects of the collapse prevention circuit 102 to maintain power supply voltages above 5-volts during the slew condition. In particular, signal trace B includes a nominal power supply voltage of approximately 5.2-volts at a first time (see label 308, corresponding to the first time 302) when the slew condition is beginning. Absent the benefit of the collapse prevention circuit 102, signal trace B would drop to zero volts in response to the slew condition. However, in view of the collapse prevention circuit 102, signal trace B illustrates that the first power supply 108 rises to a value of approximately 6.1-volts at a second time (see label 310) based on the assistance provided by the collapse prevention circuit 102 routing current to the first power supply 108. As such, the first power supply 108 maintains an appropriate (non-collapsing) voltage value throughout the duration of the slew condition.

Considering for this example the rising edge of the slew condition, the illustrated example of FIG. 3 includes signal trace C to show the output 156 of the rising edge detection circuit 104 increasing (see label 312) in response to the rising edge slew condition (label 302 through 304), thereby turning on the first transistor 226. As described above, the effect of turning on the first transistor 226 during the slew condition is that the excess slew voltage is routed (e.g., from the BST input 116) to where it is able to prevent power supply collapse from occurring. Similarly, in response to the falling edge of the slew condition, the illustrated example of FIG. 3 includes signal trace D shows the output 160 of the falling edge detection circuit 106 increasing (see label 314), thereby turning on the second transistor 234. As described above, the effect of turning on the second transistor 234 during the slew condition is that the excess slew voltage is routed (e.g., from the SH node 120) to where it is able to prevent power supply collapse from occurring.

Figure 4:
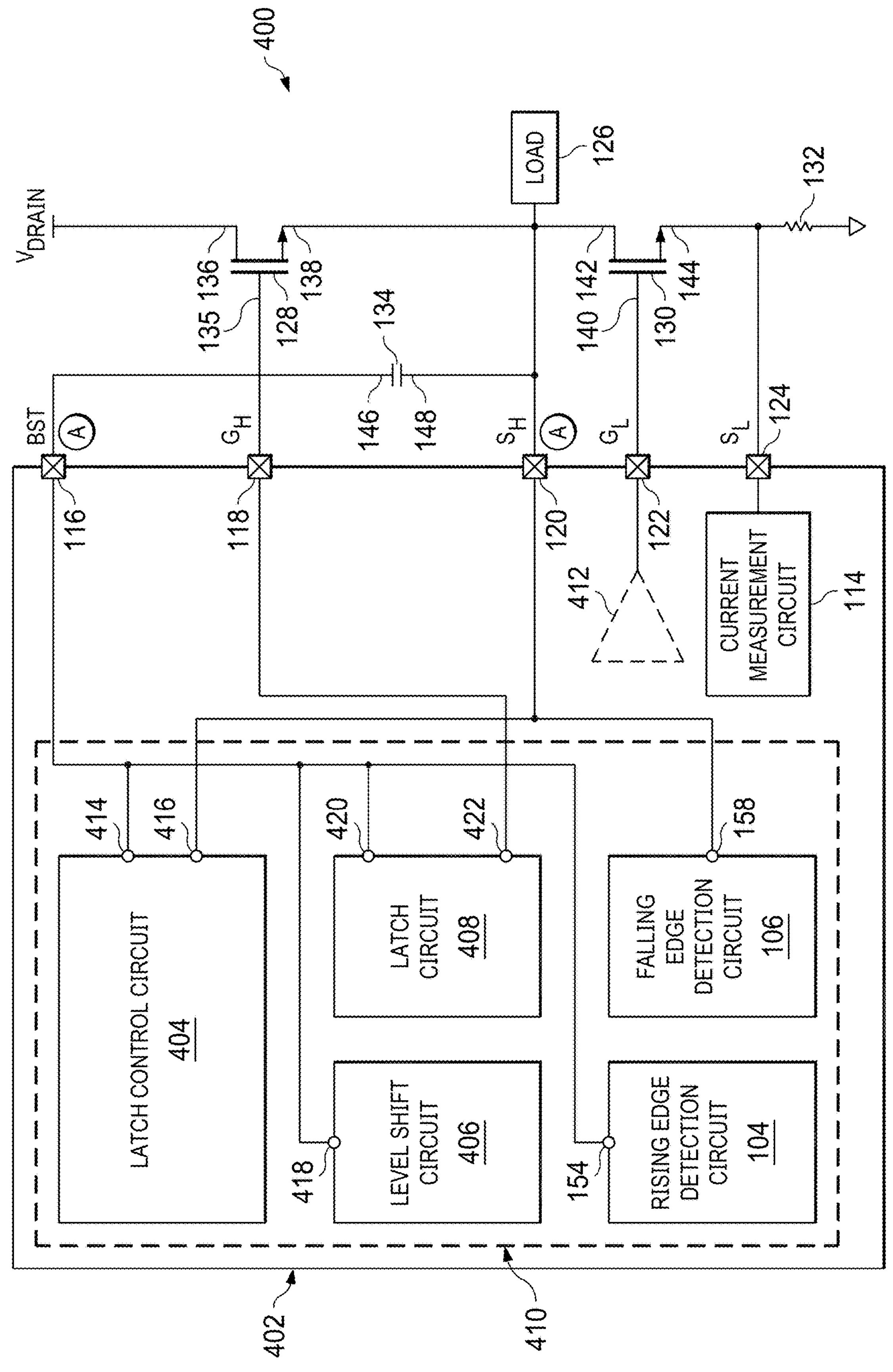
FIG. 4 is a block diagram of an example motor driver circuit in which an example state hold circuit operates to place a latch in a hold mode during a slew condition.

FIG. 4 is a block diagram of an example motor driver circuit 400 that includes an example state hold circuit 402, the bootstrap capacitor 134, the first drive switch 128, the second drive switch 130, the current sense resistor 132, and the load 126. In the illustrated example of FIG. 4, reference labels similar to those shown in FIGS. 1 and 2 will be repeated to represent same/similar structure. The example state hold circuit 402 includes a latch control circuit 404, a level shift circuit 406, a latch circuit 408, the rising edge detection circuit 104, and the falling edge detection circuit 106. The state hold circuit 402 includes a source-high (SH) hold circuit 410, and a source-low (SL) hold circuit 412. The example SH hold circuit 410 and the example SL hold circuit 412 include substantially similar circuitry, and examples will describe the SH hold circuit 410 as a matter of convenience and not limitation. The SH hold circuit 410 includes the BST node 116, the GH output 118, the SH node 120, and the SL input 124. The example latch control circuit 404 includes a first input 414, and a second input 416, the example level shift circuit 406 includes a first input 418, the example latch circuit 408 includes a first input 420 and a first output 422, the example rising edge detection circuit 104 includes the input 154, and the example falling edge detection circuit 106 includes the input 158.

In operation, the level shift circuit 406 of the motor driver circuit 400 receives relatively low voltage control signals (e.g., 5-volts) that provide control signals to the latch circuit 408 for load control. As described above, the load control may include inductive loads, such as motors or buck converters that operate at a relatively higher voltage (e.g., >100 volts) than the level shift circuit 406. The level shift circuit exhibits a degree of sensitivity in connection with parasitic capacitances, and slew conditions result in the level shift circuit being less stable or predictable. The level shift circuit 406 operates with differential inputs in which one is high when the other is low, and vice versa (as described below in connection with FIGS. 5A and 5B). These input signals cause corresponding output signals from the level shift circuit 406 to the latch circuit 408, which causes a binary state output to the first drive switch 128 in either an on or off state to couple power to the load 126 and to decouple power from the load 126 when the switch is inactive. The latch circuit 408 preserves an output state to the first drive switch 128 until another control signal is received from the level shift circuit 406.

However, in the event of a slew condition, the state of the latch circuit 408 cannot be guaranteed due to a collapse event at the BST node 116. In such circumstances, the latch circuit 408 does not receive adequate voltage to maintain its state, which results in a loss of control of the first drive switch 128 or the second drive switch 130. In some use cases, the first drive switch 128 and the second drive switch 130 are power FET transistors to control the load 126, such as a high voltage motor. In some cases, when the slew condition ends, the latch circuit 408 receives inadequate voltage to operate, and emerges from the slew condition in an indeterminate state. In the event the indeterminate state results in both the first drive switch 128 and the second drive switch 130 energizing at the same time, then a dangerous "shoot through" condition may result.

To prevent a loss of state during a slew condition, the example latch control circuit 404 places the latch circuit 408 into a hold mode to preserve the latch state. In effect, the latch control circuit 404 prevents the latch circuit 408 from getting false information (e.g., caused by parasitic capacitances) during the slew condition. As such, even in the event of false information or anomalous signals sent by the level shift circuit 406 during the slew condition, the hold mode facilitated by the latch control circuit 404 prevents the latch from changing the state it was in prior to the slew condition.

In the example of FIG. 4, the transistors 128, 130 may be n-channel metal-oxide semiconductor field-effect transistors (MOSFETs). Alternatively, the transistors 128, 130 may be n-channel field-effect transistors (FETs), n-channel insulated-gate bipolar transistors (IGBTs), n-channel junction field effect transistors (JFETs), NPN bipolar junction transistors (BJTs) or, with slight modifications, p-type equivalent devices. In some examples of FIG. 4, the transistor 128 may be a p-channel MOSFET. Alternatively, the transistor 128 may be a p-channel FET, a p-channel IGBT, a p-channel JFET, a PNP BJT, or, with slight modifications, N-type equivalent devices. The transistors 128, 130 may be depletion mode devices, drain-extended devices, enhancement mode devices, natural transistors or other type of device structure transistors. Furthermore, the transistors 128, 130 may be implemented in/over a silicon substrate (Si), a silicon carbide substrate (SiC), a gallium nitride substrate (GaN) or a gallium arsenide substrate (GaAs).

Figure 5A:
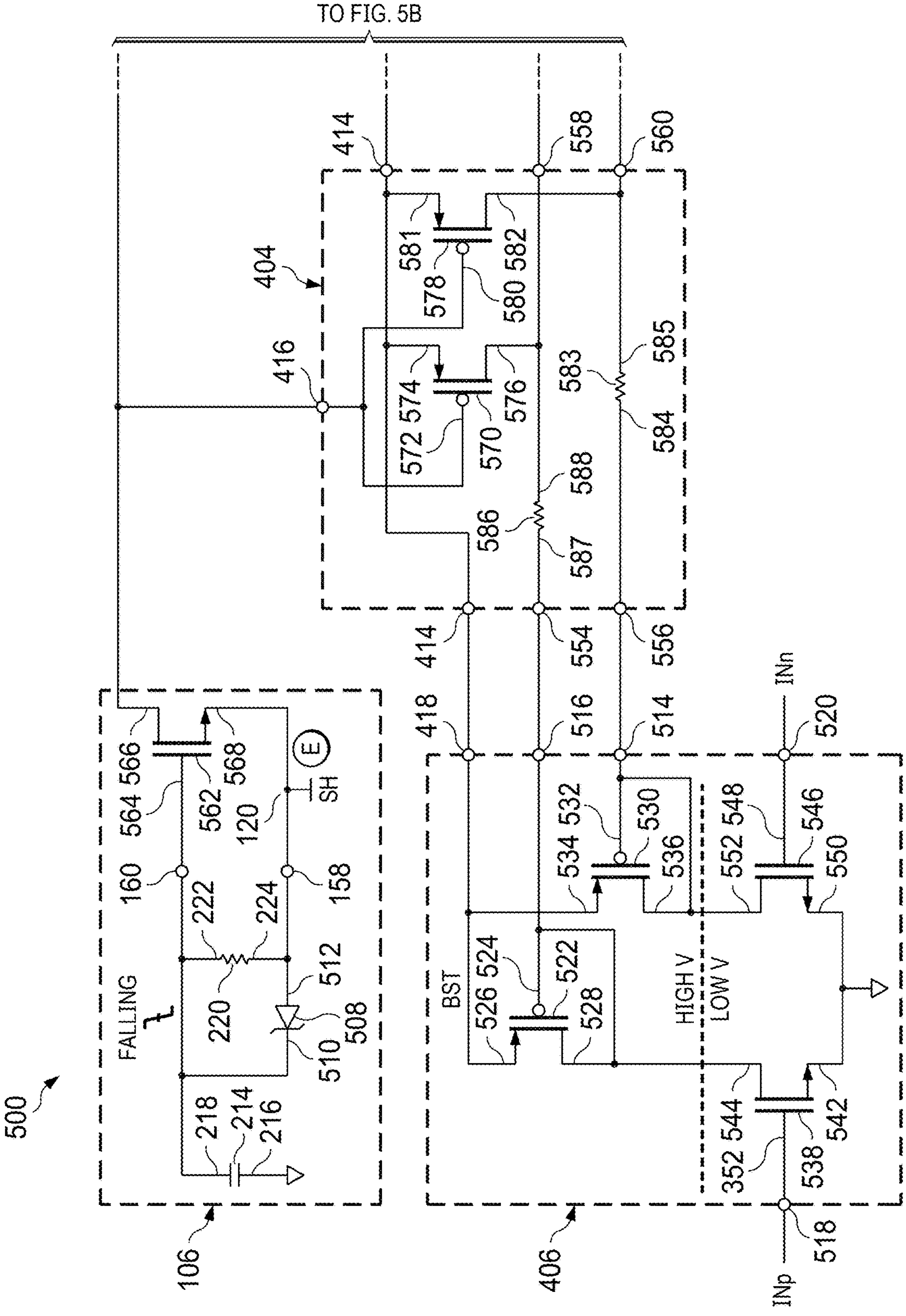
FIGS. 5A and 5B are block diagrams of a portion of the motor driver circuit of FIG. 4 to place a latch in a hold mode during a slew condition.
Figure 5B:
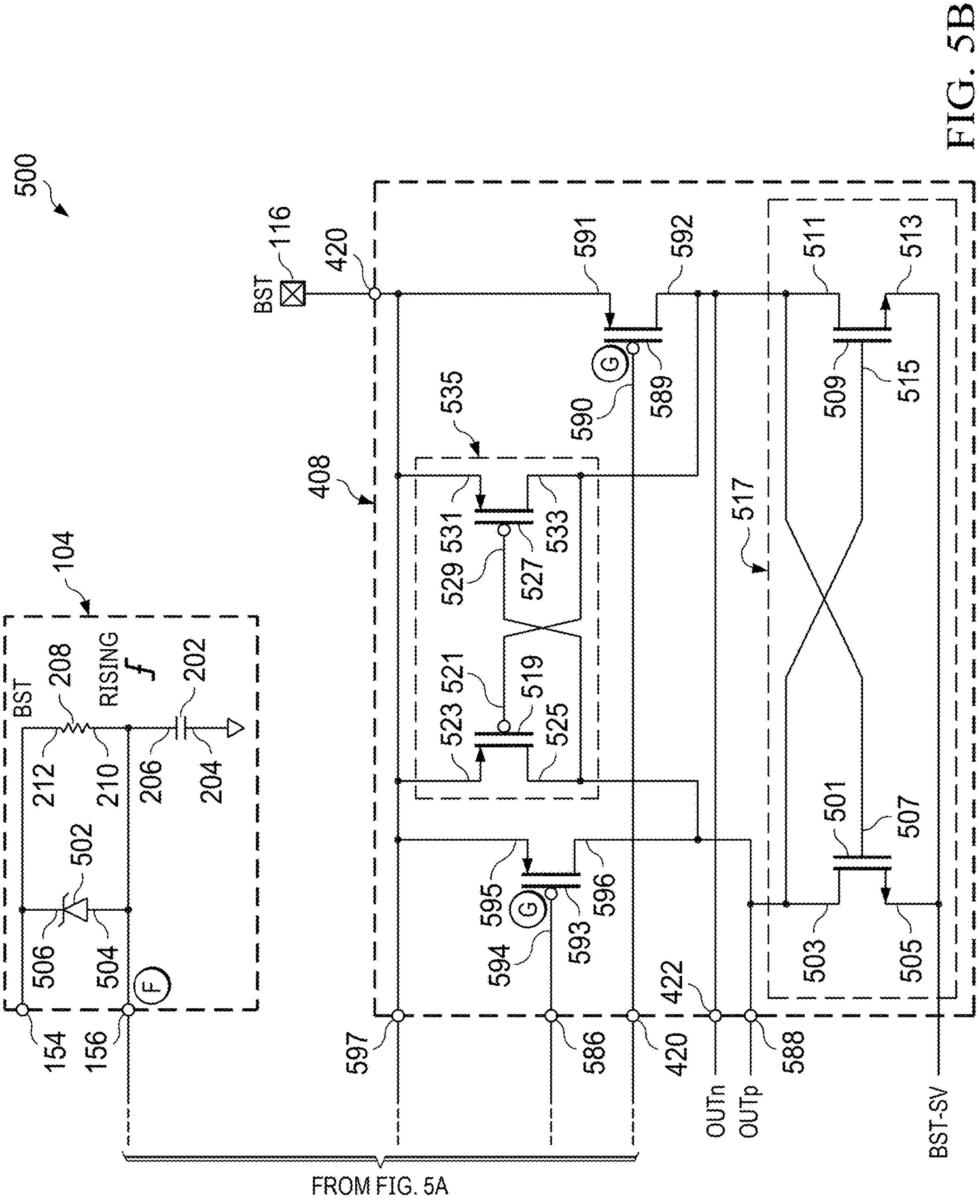

FIGS. 5A and 5B are block diagrams of a portion 500 of the motor driver circuit 400 of FIG. 4. In particular, the illustrated examples of FIGS. 5A and 5B include a circuit schematic representation of the rising edge detection circuit 104, the falling edge detection circuit 106, the level shift circuit 406, the latch circuit 408, and the latch control circuit 404. The rising edge detection circuit 104 includes the input 154, the output 156, the capacitor 202 having the first terminal 204 and the second terminal 206, the resistor 208 having the first terminal 210 and the second terminal 212, and a voltage clamp 502 having a first terminal 504 and a second terminal 506. The falling edge detection circuit 106 includes the input 158, the output 160, the capacitor 214 having the first terminal 216 and the second terminal 218, the resistor 220 having the first terminal 222 and the second terminal 224, and a clamp 508 having a first terminal 510 and a second terminal 512.

In the illustrated example of FIG. 5A, the level shift circuit 406 includes the first input 418, a first output 514, a second output 516, a second input 518, and a third input 520. As described above, the level shift circuit 406 accepts relatively low voltage control signals at the second input 518 and the third input 520 as differential signals such that one is inverted from the other to prevent dangerous shoot-through conditions of the load 126. The level shift circuit 406 of FIG. 5A includes a first transistor 522 having a control terminal 524, a source terminal 526 and a drain terminal 528. The level shift circuit 406 of FIG. 5A includes a second transistor 530 having a control terminal 532, a source terminal 534, and a drain terminal 536. The level shift circuit 406 of FIG. 5A includes a third transistor 538 having a control terminal 540, a source terminal 542, and a drain terminal 544. The level shift circuit 406 of FIG. 5A includes a fourth transistor 546 having a control terminal 548, a source terminal 550, and a drain terminal 552.

In the illustrated example of FIG. 5A, the latch control circuit 404 includes the first input 414, the second input 416, a third input 554, a fourth input 556, a second output 558, and a third output 560. The falling edge detection circuit 106 of FIG. 5A also includes a first transistor 562 having a control terminal 564 coupled to the output 160, a drain terminal 566 (e.g., a first terminal), and a source terminal 568 (e.g., a second terminal). While the illustrated example of FIG. 5A includes the first transistor 562 associated with the falling edge detection circuit 106, examples disclosed herein are not limited thereto. In some examples, the first transistor 562 may be associated with the example latch control circuit 404. The latch control circuit 404 of FIG. 5A includes a first transistor 570 (e.g., a first hold transistor) having a control terminal 572, a source terminal 574 (e.g., a second terminal), and a drain terminal 576 (e.g., a first terminal). The latch control circuit 404 of FIG. 5A includes a second transistor 578 (e.g., a second hold transistor) having a control terminal 580, a source terminal 581, and a drain terminal 582 (e.g., a first terminal). The latch control circuit 404 of FIG. 5A includes a first resistor 583 having a first terminal 584 and a second terminal 585, and a second resistor 586 having a first terminal 587 and a second terminal 588.

In the illustrated example of FIG. 5B, the latch circuit 408 includes the first input 420, a second input 586, a third input 597, the first output 422 and a second output 588. The latch circuit 408 of FIG. 5B includes a first transistor 589 having a control terminal 590, a source terminal 591, and a drain terminal 592 (e.g., a first terminal). The latch circuit 408 of FIG. 5B includes a second transistor 593 having a control terminal 594, a source terminal 595, and a drain terminal 596 (e.g., a first terminal). The latch circuit 408 of FIG. 5B includes a third transistor 501 having a drain terminal 503, a source terminal 505, and a control terminal 507. The latch circuit 408 of FIG. 5B includes a fourth transistor 509, a drain terminal 511, a source terminal 513, and a control terminal 515. The third transistor 501 and the fourth transistor 509 form a first latch 517. In some examples, the first latch 517 is referred to as a "cross coupled latch," or a "cross coupled pair." The illustrated example of FIG. 5B also includes a second latch 535, which may also be referred to as a "cross coupled latch," or a "cross coupled pair." The example second latch includes a fifth transistor 519 having a control terminal 521, a source terminal 523 and a drain terminal 525. The example second latch includes a sixth transistor 527 having a control terminal 529, a source terminal 531, and a drain terminal 533.

In operation, the level shift circuit 406 converts a low voltage input signal (e.g., 5-volts) to one of the second input 518 and the third input 520 to a relatively higher voltage output (e.g., 100-volts) across the drain and source terminals of the third transistor 538 and the fourth transistor 546, respectively. In some examples the second input 518 and the third input 520 are differential inputs that are inverted with respect to each other. In the event of a high signal input at the second input 518, which is coupled to the control terminal 540 of the third transistor 538, current flows to result in VGs at the first transistor 522 relative to the first input 418 (BST node 116). For example, if the first input 418 is 100-volts, and assuming the first transistor 522 has a 2-volt conduction between the control terminal 524 and the source terminal 526, then the voltage at the control terminal 524 will be 98-volts. The 98-volt potential is coupled to the control terminal 594 of the second transistor 593 of the latch circuit 408, which turns on the second transistor 593. In effect, energizing the second transistor 593 of the latch circuit 408 establishes its state and results in the second load output 588 to provide the voltage at BST-5V (a logic high), which drives the load 126 after further signal buffering. The first load output 422 outputs a logic low value that is based on the applied power supply, such as a floating power supply (e.g., BST-5 volts).

As the second input 518 and the third input 520 of the level shift circuit 406 alternate logic high and logic low values, the corresponding state of the latch circuit 408 changes such that one of the second transistor 593 or the first transistor 589 conducts. As long as at least one of the second transistor 593 or the first transistor 589 conducts, the state of the latch circuit 408 is preserved and the dangerous shoot-through condition is avoided. However, in the event of a slew condition the BST node 116 voltage collapses, thereby causing the latch circuit 408 to lose its state. In effect, predictable control over the first load output 422 and the second load output 588 is not possible. Also, during the slew condition the outputs of the level shift circuit 406 may generate unpredictable values in view of, for example, parasitic capacitance phenomenon occurring at the control terminal 524 of the first transistor 522 or parasitic capacitance phenomenon occurring at the control terminal 532 of the second transistor 530. As such, when the slew condition abates or otherwise subsides, such erroneous outputs from the level shift circuit 406 to the latch circuit 408 create the possibility that incorrect phases of the load 126 are being energized or two or more phases of the load 126 (e.g., two or more power FETs) are being energized at the same time (e.g., shoot-through).

Accordingly, the example latch control circuit 404 described herein places the latch circuit 408 into a hold mode during the slew condition to prevent erroneous signal inputs from changing the state of the latch circuit 408. During normal operation when there is no slew condition, the first resistor 583 and the second resistor 586 have zero current. However, during a slew condition the second input 416 of the latch control circuit 404 is driven high by one of the rising edge detection circuit 104 or the falling edge detection circuit 106, depending on the rising or falling edge of the slew condition. Because the control terminal 572 of first transistor 570 and the control terminal 580 of the second transistor 578 are coupled to the second input 416, the high signal results in conduction of the first transistor 570 and the second transistor 578. As a result, the second terminal 585 of the first resistor 583 and the second terminal 588 of the second resistor 586 are at a higher potential than the corresponding first terminal 584 of the first resistor 583 and the first terminal 587 of the second resistor 586. This results in the control terminal 590 of the first transistor 589 of the latch circuit 408 and the control terminal 594 of the second transistor 593 to be pulled up to the values of the source terminal 591 of the first transistor 589 and the source terminal 595 of the second transistor 593, respectively. In effect, this prevents or otherwise blocks indiscriminate output values of the first output 514 and the second output 516 of the level shift circuit 406 from affecting the state of the latch 517. Stated differently, the latch circuit 408 is placed in a hold mode during the slew condition so that it is immune to parasitic capacitance anomalies or erroneous input(s).

To achieve the hold mode during a slew condition, such as a slew condition occurring with a rising edge, the first terminal 204 of the capacitor 202 of the rising edge detection circuit 104 is coupled to ground and tries to restrict its upper plate (second terminal 206) when following the input 154, which corresponds to the BST node 116 where slew is occurring. A voltage difference across the resistor 208 occurs as a result, which is clamped by the voltage clamp 502. While the time constant results from operation of the resistor 208 and the capacitor 202 during the slew condition, the elevated voltage from the slew condition results in an on output signal at the output 156 of the rising edge detection circuit 104, which is coupled to the second input 416 of the latch control circuit 404, which drives the control terminal 572 of the first transistor 570 and the control terminal 580 of the second transistor 578, thereby resulting in their conduction. A similar operation occurs on a falling edge of a slew condition, in which the time constant corresponds to operation of the resistor 220 and the capacitor 214 during the slew condition. The elevated voltage from the falling edge slew condition results in a high output signal at the control terminal 564 of the third transistor 562. Conduction of the third transistor 562 generates an on signal for the control terminals of the first transistor 570 and the second transistor 578 of the latch control circuit 404, thereby resulting in their conduction. As described above, the conduction of the first transistor 570 and the second transistor 578 of the latch control circuit 404 results in the terminals of the first transistor 589 and the second transistor 593 of the latch circuit 408 to be pulled up to their respective sources to place the latch in the hold mode.

Figure 6:
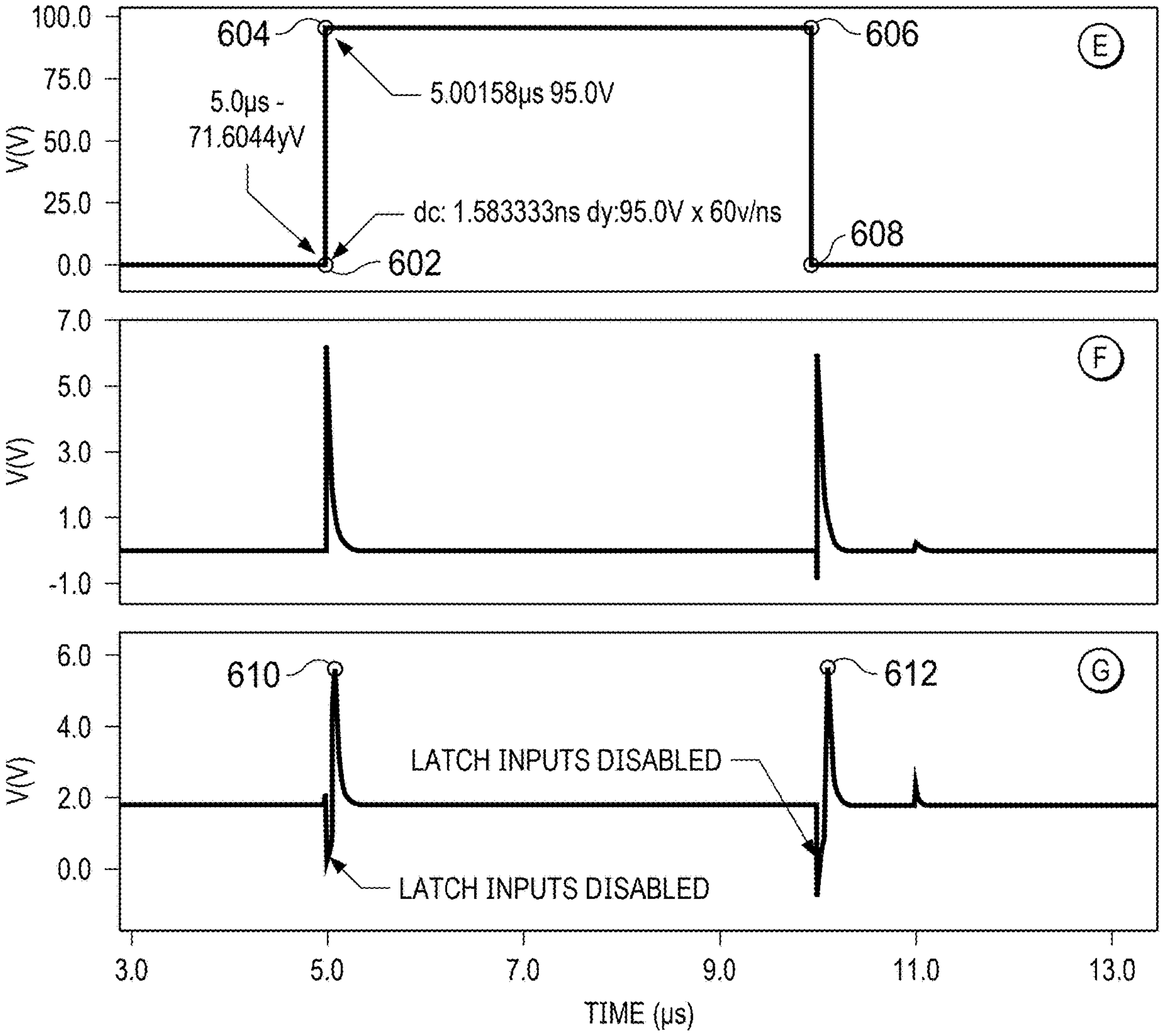
FIG. 6 is a signal diagram including three (3) signal traces corresponding to portions of the block diagrams of FIGS. 4, 5A and 5B during a slew condition.

FIG. 6 is a signal diagram 600 during slew conditions. In the illustrated example of FIG. 6, three (3) separate signal traces are shown with labels E, F and G. Signal trace E represents slew conditions at the SH node 120, but examples described herein apply to the BST node 116 in a similar manner. Signal trace E illustrates a slew rate of approximately 60-volts/nSec, and the location of signal trace E is shown in the illustrated example of FIG. 5A. In particular, signal trace E illustrates a value of approximately zero volts at a first time (see label 602) and approximately 100-volts at a second time (see label 604) on a rising edge slew event. Also, signal trace E illustrates a value of approximately 100-volts at a third time (see label 606) and approximately zero volts at a fourth time (see label 608) on a falling edge slew event. Signal trace F represents detection signals by the rising edge detection circuit 104 and the falling edge detection circuit 106 that provide control terminal inputs to the first transistor 570, the second transistor 578, and the third transistor 562 to initiate the hold mode. In particular, signal trace G is shown in the illustrated example of FIG. 5B and represents a first input 610 to the first transistor 589 and the second input 612 to the second transistor 593 of the latch circuit 408. Circuit locations corresponding to signal trace E, signal trace F and signal trace Gare shown in the illustrated example of FIG. 5B.

Figure 7:
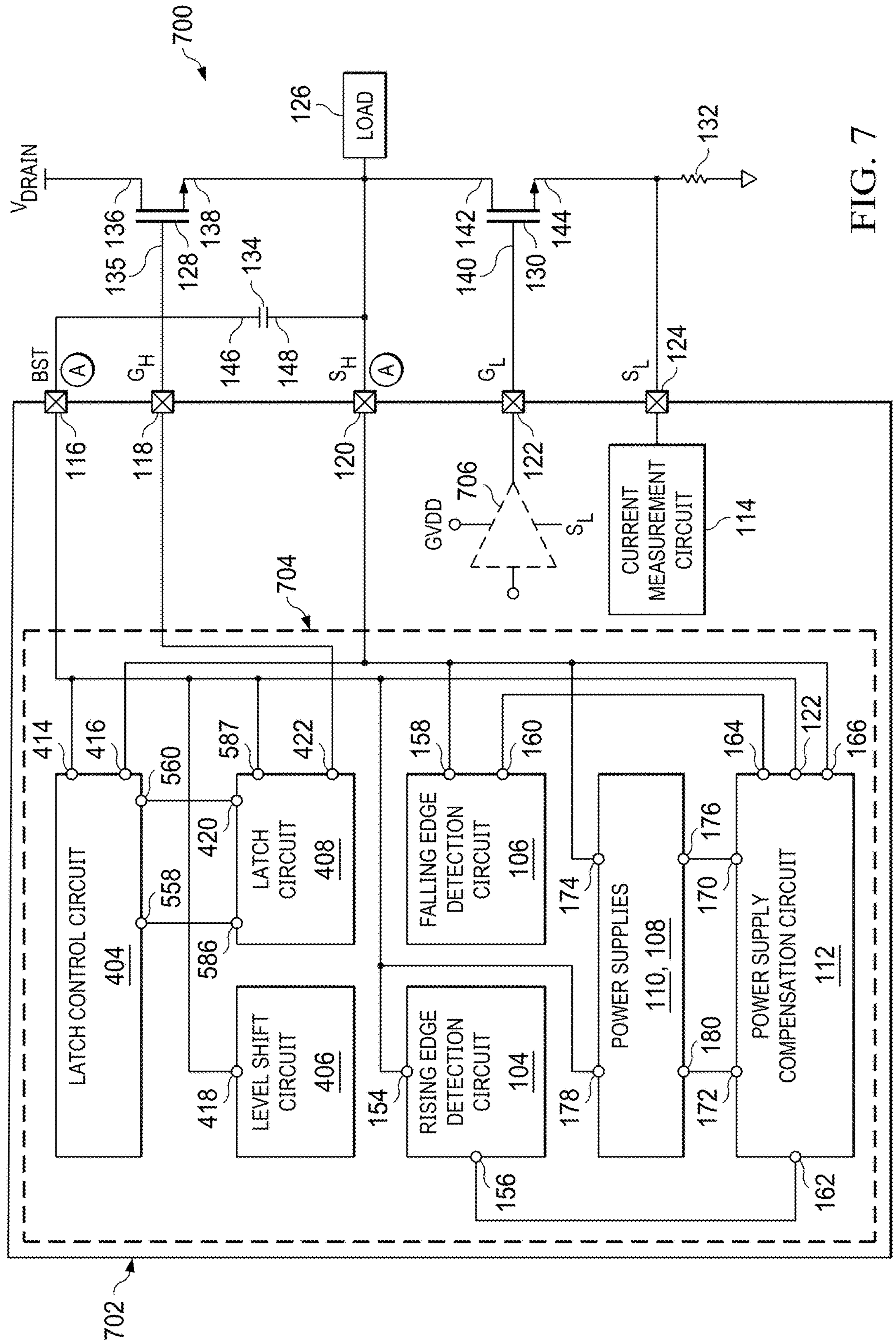
FIG. 7 is a block diagram of an example motor driver circuit in which an example slew management circuit operates to facilitate power supply collapse prevention and latch hold state capabilities during a slew condition.

FIG. 7 is a block diagram of an example motor driver circuit 700 that includes an example slew management circuit 702. While the illustrated examples of FIGS. 1 and 2 describe the example collapse prevention circuit 102 to facilitate collapse prevention in response to slew conditions, and the illustrated examples of FIGS. 4 and 5 describe the example state hold circuit 402 to hold a state of a latch in response to the slew conditions, the illustrated example of FIG. 7 describes the example slew management circuit 702, which includes facilitation of both collapse prevention and latch hold state capabilities. In the illustrated example of FIG. 7, the slew management circuit 702 includes a source-high (SH) slew management circuit 704 and a source-low (SL) slew management circuit 706. The example SH slew management circuit 702 and the example SL slew management circuit 706 include substantially similar circuitry, and examples will describe the SH slew management circuit 702 as a matter of convenience and not limitation. The SH slew management circuit 704 includes the latch control circuit 404, the level shift circuit 406, the latch circuit 408, the rising edge detection circuit 104, the falling edge detection circuit 106, the first power supply 108 and the second power supply 110, and the power supply compensation circuit 112. In some examples, the slew management circuit 702 includes a current measurement circuit 114 to determine a current through the example load 126 based on the current sense resistor 132. The slew management circuit 702 of FIG. 7 includes the BST node 116, the GH output 118, and the SH node 120. As described above, slew conditions occurring with respect to the BST node 116 and the SH node 120 are detected and managed by the example SH slew management circuit 704, and slew conditions occurring with respect to the GL output 122 are detected and managed by the example SL slew management circuit 706. In an effort to avoid duplication, examples to manage slew conditions refer to the SH slew management circuit 704 as a convenience and not limitation. The motor driver circuit 700 of FIG. 7 also includes the load 126, the first drive switch 128, the second drive switch 130, and the bootstrap capacitor 134. In some examples, the slew management circuit 702 is part of a driver circuit to drive the load 126 by activating or otherwise energizing the first drive switch 128. The first drive switch 128 includes a control terminal 135, a drain terminal 136, and a source terminal 138. The second drive switch 130 includes a control terminal 140, a drain terminal 142, and a source terminal 144. The bootstrap capacitor 134 includes a first terminal 146 and a second terminal 148.

In the illustrated example of FIG. 7, the rising edge detection circuit 104 includes an input 154 and an output 156, and the falling edge detection circuit 106 includes an input 158 and an output 160. The power supply compensation circuit 112 includes a first input 162 coupled to the output 156 of the rising edge detection circuit 104, a second input 164 coupled to the output 160 of the falling edge detection circuit 106. The power supply compensation circuit 112 also includes a third input 166 coupled to the SH output 120 (which is where slew conditions are observed with respect to the BST node 116), and a fourth input 168 coupled to the BST node 116 (which is where slew conditions are observed).

In the illustrated example of FIG. 7, the latch control circuit 404 includes the first input 414 coupled to the BST node 116, the second input 416 coupled to the SH node 120, the second output 558, and the third output 560. In particular, the latch control circuit 404 of FIG. 7 includes additional inputs and outputs described above and in further detail below. The level shift circuit 406 of FIG. 7 includes a first input 418 coupled to the BST node 116. The latch circuit 408 includes the third input 420 coupled to the BST node 116, and the first load output 422 coupled to the GH output 118.

As described above, depending on whether a slew condition occurs on a rising edge or a falling edge, the corresponding rising edge detection circuit 104 or the falling edge detection circuit 106 detects the slew condition. In response to detecting the slew condition, the rising/falling edge detection circuit 104, 106 energizes switches (e.g., transistors) within the power supply compensation circuit 112 to route elevated slew voltage or current to the first power supply 108 or the second power supply 110, as needed. In particular, to prevent collapse of the first power supply 108, the first output 170 of the power supply compensation circuit 112 routes excess slew voltage or current to the first terminal 176 of the first power supply 108, thereby using the excess/elevated slew voltage as a contribution to prevent collapse. Similarly, to prevent collapse of the second power supply 110, the second output 172 of the power supply compensation circuit 112 routes excess slew voltage or current to the first terminal 180 of the second power supply 110, thereby using the excess/elevated slew voltage as a contribution to prevent collapse.

Also, in response to detecting the slew condition, the rising/falling edge detection circuit 104, 106 energizes switches (e.g., transistors) within the latch control circuit 404 to result in the latch circuit 408 operating in a hold mode. In particular, one or more of the rising/falling edge detection circuit 104, 106 results in a high signal at the control terminal 572 of the first transistor 562 or control terminal 564 of the first transistor 562. The high signal received at control terminals of switches (e.g., transistors) of the latch control circuit 404, described above and in further detail below, activate switches to signal the latch circuit 408 to enter a hold mode, thereby preventing signal transients at inputs of the latch circuit 408 from resulting in a change of state during the slew condition.

In the example of FIG. 7, the transistors 128, 130 may be n-channel metal-oxide semiconductor field-effect transistors (MOSFETs). Alternatively, the transistors 128, 130 may be n-channel field-effect transistors (FETs), n-channel insulated-gate bipolar transistors (IGBTs), n-channel junction field effect transistors (JFETs), NPN bipolar junction transistors (BJTs) or, with slight modifications, p-type equivalent devices. In some examples of FIG. 7, the transistor 128, is a p-channel MOSFET. Alternatively, the transistors 128, 130 may be p-channel FETs, p-channel IGBTs, p-channel JFETs, PNP BJTs, or, with slight modifications, N-type equivalent devices. The transistors 128, 138 may be depletion mode devices, drain-extended devices, enhancement mode devices, natural transistors or other type of device structure transistors. Furthermore, the transistors 128, 130 may be implemented in/over a silicon substrate (Si), a silicon carbide substrate (SiC), a gallium nitride substrate (GaN) or a gallium arsenide substrate (GaAs).

Figure 8A:
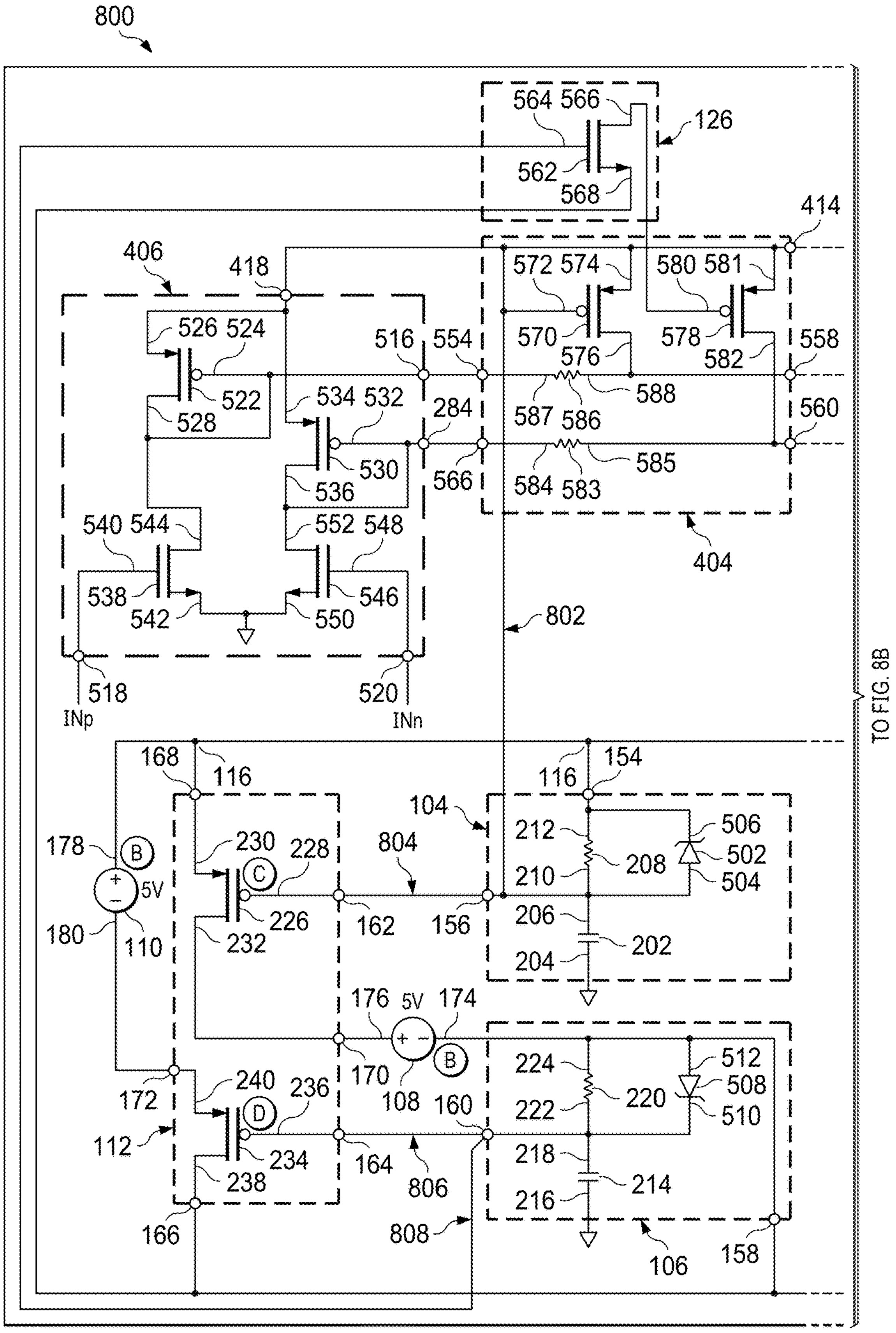
FIGS. 8A and 8B are block diagrams of a portion of the motor driver circuit of FIG. 7 to facilitate power supply collapse prevention and latch hold state capabilities during a slew condition.
Figure 8B:
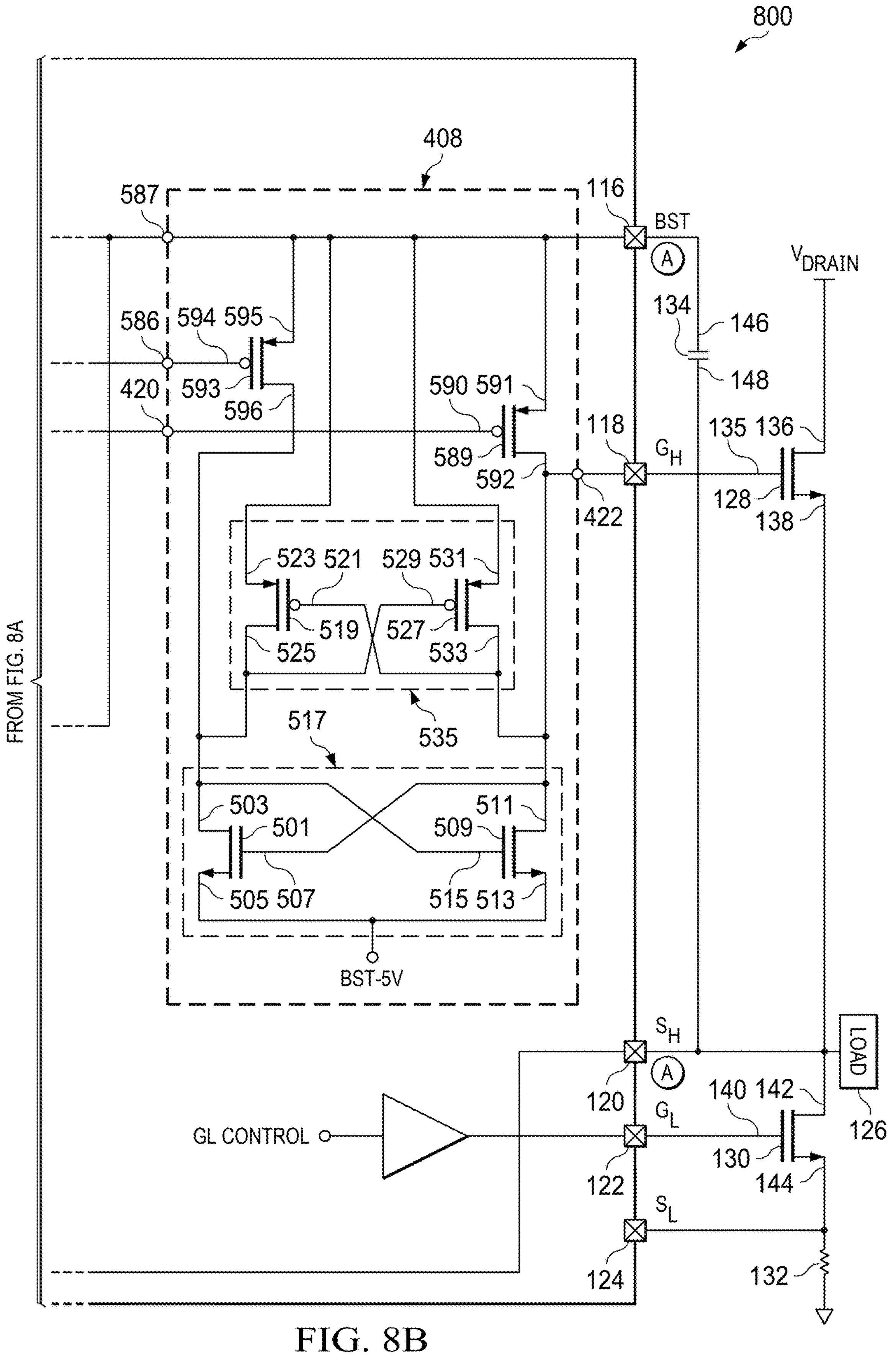

FIGS. 8A and 8B are block diagrams of a motor driver circuit 800 similar to the motor driver circuit 700 of FIG. 7 but includes circuit schematic representations of the latch control circuit 404, the level shift circuit 406, the latch circuit 408, the rising edge detection circuit 104, the falling edge detection circuit 106, the first power supply 108, the second power supply 110, and the power supply compensation circuit 112. The example motor driver circuit 800 is shown on FIGS. 8A and 8B as a matter of convenience based on the number of elements thereof and page size. As described above in connection with FIG. 7, the illustrated example circuit schematics of FIGS. 8A and 8B facilitate both collapse prevention capabilities and latch hold state capabilities. As such, particular circuits that have been described above in connection with FIGS. 1, 2, 4, and 5 are shown in FIGS. 8A and 8B, but will not be described again. In particular, the example latch control circuit 404, the example level shift circuit 406, the example latch circuit 408, the example rising edge detection circuit 104, and the example falling edge detection circuit 106 are described above in connection with FIGS. 5A and 5B. Also, the example first power supply 108, the example second power supply 110, and the power supply compensation circuit 112 are described above in connection with FIG. 2. However, the illustrated example of FIGS. 8A and 8B include the following example modifications (see nets 802, 804, 806, and 808 described below) to facilitate both collapse prevention capabilities and latch hold state capabilities.

The illustrated example of FIG. 8A includes a first net 802 and a second net 804 to couple the rising edge detection circuit 104 in a manner that facilitates both state hold capabilities and power supply collapse prevention capabilities. In particular, the rising edge detection circuit 104 includes the first net 802 coupled between the output 156 of the rising edge detection circuit 104 and the second input 416 of the latch control circuit 404 to facilitate hold mode capabilities during a rising edge slew condition. Also, the rising edge detection circuit 104 includes the second net 804 coupled between the output 156 of the rising edge detection circuit 104 and the first input 162 of the power supply compensation circuit 112 to facilitate power supply collapse prevention capabilities during a rising edge slew condition.

The illustrated example of FIG. 8A also includes a third net 806 and a fourth net 808 to couple the falling edge detection circuit 106 in a manner that facilitates both state hold capabilities and power supply collapse prevention capabilities. In particular, the falling edge detection circuit 106 includes the third net 806 coupled between the second output 160 of the falling edge detection circuit 106 and the second input 164 of the power supply compensation circuit 112 to facilitate power supply collapse prevention during a falling edge slew condition. Also, the falling edge detection circuit 106 includes the fourth net 808 coupled between the second output 160 of the falling edge detection circuit 106 and the control terminal 564 of the first transistor 562 of the falling edge detection circuit 106 to facilitate hold mode capabilities during a falling edge slew condition.

Example structure of FIGS. 8A and 8B address and/or otherwise manage the motor driver circuit 800 with regard to slew conditions that may occur on the BST node 116 and the SH node 120. As described above, slew conditions may also occur on the SL input 124. In particular, the example SL collapse prevention circuit 152 of FIG. 1 includes structure substantially similar to that of the SH collapse prevention circuit 150 and is not described further herein as a matter of convenience. Similarly, and as described above, the example SL hold circuit 412 of FIG. 4 includes structure substantially similar to that of the SH hold circuit 410 and is not described further herein as a matter of convenience. In the illustrated example of FIG. 8B, an example source-low (SL) slew management circuit 410 that includes structure of the example SL collapse prevention circuit 152 and the SL hold circuit 412, and is not described further herein as a matter of convenience.

"Including" and "comprising" (and all forms and tenses thereof) are used herein to be open ended terms. Thus, whenever a claim employs any form of "include" or "comprise" (e.g., comprises, includes, comprising, including, having, etc.) as a preamble or within a claim recitation of any kind, additional elements, terms, etc., may be present without falling outside the scope of the corresponding claim or recitation. As used herein, when the phrase "at least" is used as the transition term in, for example, a preamble of a claim, it is open-ended in the same manner as the term "comprising" and "including" are open ended. The term "and/or" when used, for example, in a form such as A, B, and/or C refers to any combination or subset of A, B, C such as (1) A alone, (2) B alone, (3) C alone, (4) A with B, (5) A with C, (6) B with C, or (7) A with B and with C. As used herein in the context of describing structures, components, items, objects and things, the phrase "at least one of A and B" refers to implementations including any of (1) at least one A, (2) at least one B, or (3) at least one A and at least one B. Similarly, as used herein in the context of describing structures, components, items, objects and things, the phrase "at least one of A or B" refers to implementations including any of (1) at least one A, (2) at least one B, or (3) at least one A and at least one B. As used herein in the context of describing the performance or execution of processes, instructions, actions, activities, etc., the phrase "at least one of A and B" refers to implementations including any of (1) at least one A, (2) at least one B, or (3) at least one A and at least one B. Similarly, as used herein in the context of describing the performance or execution of processes, instructions, actions, activities, etc., the phrase "at least one of A or B" refers to implementations including any of (1) at least one A, (2) at least one B, or (3) at least one A and at least one B.

As used herein, singular references (e.g., "a," "an," "first," "second," etc.) do not exclude a plurality. The term "a" or "an" object, as used herein, refers to one or more of that object. The terms "a" (or "an"), "one or more," and "at least one" are used interchangeably herein. Furthermore, although individually listed, a plurality of means, elements, or actions may be implemented by, e.g., the same entity or object. Also, although individual features may be included in different examples or claims, these may possibly be combined, and the inclusion in different examples or claims does not imply that a combination of features is at least one of not feasible or advantageous.

As used herein, unless otherwise stated, the term "above" describes the relationship of two parts relative to Earth. A first part is above a second part, if the second part has at least one part between Earth and the first part. Likewise, as used herein, a first part is "below" a second part when the first part is closer to the Earth than the second part. As noted above, a first part can be above or below a second part with one or more of: other parts therebetween, without other parts therebetween, with the first and second parts touching, or without the first and second parts being in direct contact with one another.

As used herein, connection references (e.g., attached, coupled, connected, and joined) may include intermediate members between the elements referenced by at least one of the connection reference or relative movement between those elements unless otherwise indicated. As such, connection references do not necessarily infer that two elements are directly connected or in fixed relation to each other. As used herein, stating that any part is in "contact" with another part is defined to mean that there is no intermediate part between the two parts.

Unless specifically stated otherwise, descriptors such as "first," "second," "third," etc., are used herein without imputing or otherwise indicating any meaning of priority, physical order, arrangement in a list, or ordering in any way, but are merely used as at least one of labels or arbitrary names to distinguish elements for ease of understanding the described examples. In some examples, the descriptor "first" may be used to refer to an element in the detailed description, while the same element may be referred to in a claim with a different descriptor such as "second" or "third." In such instances, such descriptors are used merely for identifying those elements distinctly within the context of the discussion (e.g., within a claim) in which the elements might, for example, otherwise share a same name.

As used herein, "approximately" and "about" modify their subjects/values to recognize the potential presence of variations that occur in real world applications. For example, "approximately" and "about" may modify dimensions that may not be exact due to at least one of manufacturing tolerances or other real-world imperfections. For example, "approximately" and "about" may indicate such dimensions may be within a tolerance range of +/−10% unless otherwise specified herein.

As used herein "substantially real time" refers to occurrence in a near instantaneous manner recognizing there may be real world delays for computing time, transmission, etc. Thus, unless otherwise specified, "substantially real time" refers to real time +/−1 second.

As used herein, the phrase "in communication," including variations thereof, encompasses one of or a combination of direct communication or indirect communication through one or more intermediary components, and does not require direct physical (e.g., wired) communication or constant communication, but rather also includes selective communication at least one of periodic intervals, scheduled intervals, aperiodic intervals, or one-time events.

In this description, the term "couple" may cover connections, communications, or signal paths that enable a functional relationship consistent with this description. For example, if device A generates a signal to control device B to perform an action: (a) in a first example, device A is coupled to device B by direct connection; or (b) in a second example, device A is coupled to device B through intervening component C if intervening component C does not alter the functional relationship between device A and device B, such that device B is controlled by device A via the control signal generated by device A.

As used herein, the terms "terminal," "node," "interconnection," "pin" and "lead" are used interchangeably. Unless specifically stated to the contrary, these terms are generally used to mean an interconnection between or a terminus of a device element, a circuit element, an integrated circuit, a device or other electronics or semiconductor component.

In the description and claims, described "circuitry" may include one or more circuits. A circuit or device that is described herein as including certain components may instead be adapted to be coupled to those components to form the described circuitry or device. For example, a structure described as including one or more semiconductor elements (such as transistors), one or more passive elements (such as one of or a combination of resistors, capacitors, or inductors), or one or more sources (such as voltage and/or current sources) may instead include only the semiconductor elements within a single physical device (e.g., at least one of a semiconductor die or integrated circuit (IC) package) and may be adapted to be coupled to at least some of the passive elements or the sources to form the described structure either at a time of manufacture or after a time of manufacture, for example, by at least one of an end-user or a third-party.

Circuits described herein are reconfigurable to include the replaced components to provide functionality at least partially similar to functionality available prior to the component replacement. Components shown as resistors, unless otherwise stated, are generally representative of any one or more elements coupled in at least one of series or parallel to provide an amount of impedance represented by the shown resistor. For example, a resistor or capacitor shown and described herein as a single component may instead be multiple resistors or capacitors, respectively, coupled in parallel between the same nodes. For example, a resistor or capacitor shown and described herein as a single component may instead be multiple resistors or capacitors, respectively, coupled in series between the same two nodes as the single resistor or capacitor. While certain elements of the described examples are included in an integrated circuit and other elements are external to the integrated circuit, in other examples, additional or fewer features may be incorporated into the integrated circuit. In addition, some or all of the features illustrated as being external to the integrated circuit may be included in the integrated circuit and some features illustrated as being internal to the integrated circuit may be incorporated outside of the integrated. As used herein, the term "integrated circuit" means one or more circuits that are at least one of: (i) incorporated in/over a semiconductor substrate; (ii) incorporated in a single semiconductor package; (iii) incorporated into the same module; or (iv) incorporated in/on the same printed circuit board.

Uses of the phrase "ground" in the foregoing description include at least one of a chassis ground, an Earth ground, a floating ground, a virtual ground, a digital ground, a common ground, or any other form of ground connection applicable to, or suitable for, the teachings of this description. Unless otherwise stated, "about," "approximately," or "substantially" preceding a value means+/−10 percent of the stated value, or, if the value is zero, a reasonable range of values around zero.

Modifications are possible in the described embodiments, and other embodiments are possible, within the scope of the claims.

From the foregoing, it will be appreciated that example apparatus have been described that mitigate the harmful or otherwise disabling effects to driver control circuits that result from the presence of slew conditions. While prior approaches to mitigate such effects included latencies associated with low level monitoring circuitry to detect the slew conditions, and subsequent one-shot current devices that needed to be instantiated by the monitoring circuitry, examples described herein improve responsivity when mitigating the slew condition's effects. Rather than apply additional cost and die real estate with low level monitoring circuitry and one-shot current devices, examples described herein utilize or otherwise re-direct the excess voltage potential in a manner that prevents power supply collapse and holds a state of latch circuitry during the slew condition.

What is claimed is:

1. A circuit comprising:
- a rising edge detection circuit including an input and an output;
- a falling edge detection circuit including an input and an output;
- a power supply compensation circuit including a first input, a second input, a first output, and a second output, the first input coupled to the output of the rising edge detection circuit, the second input coupled to the output of the falling edge detection circuit;
- a first power supply having a first terminal and a second terminal, the first terminal coupled to the first output of the power supply compensation circuit; and
- a second power supply having a first terminal and a second terminal, the first terminal coupled to the second output of the power supply compensation circuit.

2. The circuit of claim 1, wherein the rising edge detection circuit includes:
- a capacitor having a terminal; and
- a resistor having a first terminal coupled to the terminal of the capacitor and a second terminal coupled to the input of the rising edge detection circuit.

3. The circuit of claim 2, wherein the power supply compensation circuit includes a transistor having a control terminal, a first terminal and a second terminal, the control terminal coupled to the terminal of the capacitor, the first terminal coupled to the first terminal of the first power supply, the second terminal coupled to the input of the rising edge detection circuit.

4. The circuit of claim 3, wherein the transistor is a field-effect transistor (FET).

5. The circuit of claim 4, wherein the FET is a P-channel FET (PFET).

6. The circuit of claim 1, wherein the falling edge detection circuit includes:
- a capacitor having a terminal; and
- a resistor having a first terminal coupled to the terminal of the capacitor and a second terminal coupled to the input of the falling edge detection circuit.

7. The circuit of claim 6, wherein the power supply compensation circuit includes a transistor having a control terminal, a first terminal, and a second terminal, the control terminal coupled to the terminal of the capacitor, the first terminal coupled to the first terminal of the second power supply, the second terminal coupled to the input of the falling edge detection circuit.

8. The circuit of claim 7, wherein the transistor is a field-effect transistor (FET).

9. The circuit of claim 8, wherein the FET is an N-channel FET (NFET).

10. The circuit of claim 1, wherein at least one of the first power supply or the second power supply is a floating power supply.

11. The circuit of claim 1, further including:

a latch control circuit including:

a first transistor having a control terminal, a first terminal, and a second terminal;

a second transistor having a control terminal, a first terminal, and a second terminal; and a third transistor having a control terminal, a first terminal, and a second terminal, the control terminal of the first transistor and the control terminal of the second transistor coupled to (a) the output of the rising edge detection circuit and (b) the first terminal of the third transistor; and a latch circuit including a first control input and a second control input, the first terminal of the first transistor coupled to the second control input and the first terminal of the second transistor coupled to the first control input.

12. The circuit of claim 11, wherein the latch circuit includes:

a fourth first transistor having a control terminal, a first terminal, and a second terminal; and a fifth transistor having a control terminal, a first terminal, and a second terminal, the control terminal of the fourth transistor coupled to the first control input and the control terminal of the fifth transistor coupled to the second control input.

13. A circuit comprising:

a rising edge detection circuit including an input and an output;

a falling edge detection circuit including an input and an output, the falling edge detection circuit including a first transistor having a control terminal coupled to the output of the falling edge detection circuit, a first terminal coupled to the output of the rising edge detection circuit, and a second terminal coupled to the input of the falling edge detection circuit;

a latch control circuit including:

a second transistor having a first control terminal, a first terminal, and a second terminal, the control terminal coupled to the output of the rising edge detection circuit;

a third transistor having a second control terminal, a first terminal, and a second terminal, the control terminal coupled to the output of the rising edge detection circuit, the second terminal coupled to the second terminal of the second transistor;

a first resistor having a first terminal coupled to a first output of a level shift circuit and a second terminal coupled to the first terminal of the third transistor; and a second resistor having a first terminal coupled to a second output of the level shift circuit and a second terminal coupled to the first terminal of the second transistor; and a latch circuit including a first control input and a second control input, the first terminal of the second transistor coupled to the second control input, and the first terminal of the third transistor coupled to the first control input.

14. The circuit of claim 13, wherein the latch circuit includes:

a fourth transistor having a control terminal, a first terminal, and a second terminal, the control terminal coupled to the second terminal of the first resistor, the second terminal coupled to the second terminal of the second transistor and the second terminal of the third transistor;

a fifth transistor having a control terminal, a first terminal, and a second terminal, the control terminal coupled to the second terminal of the second resistor, the second terminal coupled to the second terminal of the second transistor and the second terminal of the third transistor;

a first load output coupled to the first terminal of the fourth transistor; and a second load output coupled to the first terminal of the fifth transistor.

15. The circuit of claim 14, wherein:

the control terminal of the fourth transistor is coupled to the first terminal of the third transistor; and the control terminal of the fifth transistor is coupled to the first terminal of the second transistor.

16. The circuit of claim 13, further including the level shift circuit including:

the first output;

the second output;

a fourth transistor having a control terminal, a first terminal, and a second source-terminal, the control terminal coupled to the first terminal and the second output, the second terminal coupled to the second terminal of the second transistor and the second terminal of the third transistor; and a fifth transistor having a control terminal, a first terminal, and a second source-terminal, the control terminal coupled to the first terminal and the first output, the second terminal coupled to the second terminal of the second transistor and the second terminal of the third transistor.

17. The circuit of claim 16, wherein the control terminal of the fourth first-transistor is coupled to the first terminal the second resistor, and the control terminal of the fifth transistor is coupled to the first terminal of the first resistor.

18. The circuit of claim 17, wherein the latch circuit includes:

a sixth transistor having a control terminal, a first terminal, and a second terminal, the control terminal coupled to the second terminal of the second resistor, the second terminal coupled to the second terminal of the second transistor and the second terminal of the third transistor; and a seventh transistor having a control terminal, a first terminal, and a second terminal, the control terminal coupled to the second terminal of the first resistor, the second terminal coupled to the second terminal of the second transistor and the second terminal of the third transistor.

19. The circuit of claim 13, further including:

a first power supply having a first terminal and a second terminal;

a second power supply having a first terminal and a second terminal; and a power supply compensation circuit including a first input coupled to the output of the rising edge detection circuit, a second input coupled to the output of the falling edge detection circuit, a first output coupled to the first terminal of the first power supply, and a second output coupled to the first terminal of the second power supply.

20. The circuit of claim 19, wherein:

the second terminal of the first power supply is coupled to the input of the falling edge detection circuit; and the second terminal of the second power supply is coupled to the input of the rising edge detection circuit.

* * * * *